United States Patent
Ahn et al.

(10) Patent No.: US 9,064,866 B2
(45) Date of Patent: Jun. 23, 2015

(54) HIGH-K DIELECTRICS WITH GOLD NANO-PARTICLES

(71) Applicant: Micron Technology, Inc., Boise, ID (US)

(72) Inventors: Kie Y. Ahn, Chappaqua, NY (US); Leonard Forbes, Corvallis, OR (US)

(73) Assignee: Micro Technology, Inc., Boise, ID (US)

(*) Notice: Subject to any disclaimer, the term of this patent is extended or adjusted under 35 U.S.C. 154(b) by 50 days.

(21) Appl. No.: 13/757,290

(22) Filed: Feb. 1, 2013

(65) Prior Publication Data

US 2013/0153986 A1    Jun. 20, 2013

Related U.S. Application Data

(62) Division of application No. 11/810,004, filed on Jun. 4, 2007, now Pat. No. 8,367,506.

(51) Int. Cl.
*H01L 27/108* (2006.01)
*H01L 29/51* (2006.01)
(Continued)

(52) U.S. Cl.
CPC ........ *H01L 29/517* (2013.01); *H01L 21/28194* (2013.01); *H01L 21/28273* (2013.01); *H01L 29/42332* (2013.01); *H01L 29/495* (2013.01); *H01L 29/513* (2013.01)

(58) Field of Classification Search
CPC ............... H01L 29/517; H01L 29/513; H01L 29/42332; H01L 29/495; H01L 21/28194; H01L 21/28273
USPC .................. 257/287, 396; 438/310, E21.209, 438/E21.662, E29.345
See application file for complete search history.

(56) References Cited

U.S. PATENT DOCUMENTS 3,571,918 A    3/1971    Haberecht
5,149,596 A    9/1992    Smith et al.
(Continued)

FOREIGN PATENT DOCUMENTS

EP             1462415 A2     9/2004
WO    WO-2004000728 A1    12/2003

OTHER PUBLICATIONS

Aarik, J., et al., "Phase transformations in hafnium dioxide thin films grown by atomic layer deposition at high temperatures", Applied Surface Science, 173(1-2), (Mar. 2001), 15-21.
(Continued)

*Primary Examiner* — Colleen A Matthews
*Assistant Examiner* — Colleen E Snow
(74) *Attorney, Agent, or Firm* — Schwegman Lundberg & Woessner, P.A.

(57) ABSTRACT

A metal oxide semiconductor (MOS) structure having a high dielectric constant gate insulator layer containing gold (Au) nano-particles is presented with methods for forming the layer with high step coverage of underlying topography, high surface smoothness, and uniform thickness. The transistor may form part of a logic device, a memory device, a persistent memory device, a capacitor, as well as other devices and systems. The insulator layer may be formed using atomic layer deposition (ALD) to reduce the overall device thermal exposure. The insulator layer may be formed of a metal oxide, a metal oxycarbide, a semiconductor oxide, or semiconductor oxide oxycarbide, and the gold nano-particles in insulator layer increase the work function of the insulator layer and affect the tunneling current and the threshold voltage of the transistor.

20 Claims, 4 Drawing Sheets

(51) Int. Cl.
    *H01L 21/28* (2006.01)
    *H01L 29/423* (2006.01)
    *H01L 29/49* (2006.01)

(56) References Cited

U.S. PATENT DOCUMENTS

| | | | |
|---|---|---|---|
| 5,434,878 A | 7/1995 | Lawandy | |
| 5,455,489 A | 10/1995 | Bhargava | |
| 5,516,588 A | 5/1996 | van den Berg et al. | |
| 5,585,020 A | 12/1996 | Becker et al. | |
| 5,652,061 A | 7/1997 | Jeng et al. | |
| 5,662,834 A | 9/1997 | Schulz et al. | |
| 5,714,336 A | 2/1998 | Simons et al. | |
| 5,714,766 A | 2/1998 | Chen et al. | |
| 5,770,022 A | 6/1998 | Chang et al. | |
| 5,772,760 A | 6/1998 | Gruen et al. | |
| 5,851,880 A | 12/1998 | Ikegami | |
| 5,874,134 A | 2/1999 | Rao et al. | |
| 5,882,779 A | 3/1999 | Lawandy | |
| 5,939,146 A | 8/1999 | Lavernia | |
| 5,962,132 A | 10/1999 | Chang et al. | |
| 5,989,511 A | 11/1999 | Gruen et al. | |
| 6,025,034 A | 2/2000 | Strutt et al. | |
| 6,060,743 A | 5/2000 | Sugiyama et al. | |
| 6,063,705 A | 5/2000 | Vaartstra | |
| RE36,760 E | 7/2000 | Bloomquist et al. | |
| 6,129,928 A | 10/2000 | Sarangapani et al. | |
| 6,140,181 A | 10/2000 | Forbes et al. | |
| H1924 H | 12/2000 | Zabinski et al. | |
| 6,162,712 A | 12/2000 | Baum et al. | |
| 6,174,677 B1 | 1/2001 | Vo-Dinh | |
| 6,184,550 B1 | 2/2001 | Van Buskirk et al. | |
| 6,194,237 B1 | 2/2001 | Kim et al. | |
| 6,208,881 B1 | 3/2001 | Champeau | |
| 6,232,643 B1 | 5/2001 | Forbes et al. | |
| 6,246,606 B1 | 6/2001 | Forbes et al. | |
| 6,277,448 B2 | 8/2001 | Strutt et al. | |
| 6,291,314 B1 | 9/2001 | Henley et al. | |
| 6,291,341 B1 | 9/2001 | Sharan et al. | |
| 6,297,095 B1 | 10/2001 | Muralidhar et al. | |
| 6,313,015 B1 | 11/2001 | Lee et al. | |
| 6,317,175 B1 | 11/2001 | Salerno et al. | |
| 6,331,282 B1 | 12/2001 | Manthiram et al. | |
| 6,346,189 B1 | 2/2002 | Dai et al. | |
| 6,346,477 B1 | 2/2002 | Kaloyeros et al. | |
| 6,351,411 B2 | 2/2002 | Forbes et al. | |
| 6,414,543 B1 | 7/2002 | Beigel et al. | |
| 6,447,764 B1 | 9/2002 | Bayer et al. | |
| 6,447,848 B1 | 9/2002 | Chow et al. | |
| 6,458,431 B2 | 10/2002 | Hill et al. | |
| 6,472,632 B1 | 10/2002 | Peterson et al. | |
| 6,495,436 B2 | 12/2002 | Ahn et al. | |
| 6,514,828 B2 | 2/2003 | Ahn et al. | |
| 6,534,420 B2 | 3/2003 | Ahn et al. | |
| 6,545,314 B2 | 4/2003 | Forbes et al. | |
| 6,572,836 B1 | 6/2003 | Schulz et al. | |
| 6,580,124 B1 | 6/2003 | Cleeves et al. | |
| 6,586,785 B2 | 7/2003 | Flagan et al. | |
| 6,587,408 B1 | 7/2003 | Jacobson et al. | |
| 6,592,839 B2 | 7/2003 | Gruen et al. | |
| 6,638,575 B1 | 10/2003 | Chen et al. | |
| 6,642,782 B2 | 11/2003 | Beigel et al. | |
| 6,645,569 B2 | 11/2003 | Cramer et al. | |
| 6,653,591 B1 | 11/2003 | Peterson et al. | |
| 6,656,792 B2 | 12/2003 | Choi et al. | |
| 6,669,823 B1 | 12/2003 | Sarkas et al. | |
| 6,669,996 B2 | 12/2003 | Ueno et al. | |
| 6,677,204 B2 | 1/2004 | Cleeves et al. | |
| 6,689,192 B1 | 2/2004 | Phillips et al. | |
| 6,713,329 B1 | 3/2004 | Wagner et al. | |
| 6,713,812 B1 | 3/2004 | Hoefler et al. | |
| 6,723,606 B2 | 4/2004 | Flagan et al. | |
| 6,746,893 B1 | 6/2004 | Forbes et al. | |
| 6,755,886 B2 | 6/2004 | Phillips et al. | |
| 6,756,292 B2 | 6/2004 | Lee et al. | |
| 6,764,874 B1 | 7/2004 | Zhang et al. | |
| 6,767,419 B1 | 7/2004 | Branagan | |
| 6,767,795 B2 | 7/2004 | Ahn et al. | |
| 6,787,122 B2 | 9/2004 | Zhou | |
| 6,801,415 B2 | 10/2004 | Slaughter et al. | |
| 6,815,781 B2 | 11/2004 | Vyvoda et al. | |
| 6,830,676 B2 | 12/2004 | Deevi | |
| 6,831,310 B1 | 12/2004 | Mathew et al. | |
| 6,839,280 B1 | 1/2005 | Chindalore et al. | |
| 6,842,370 B2 | 1/2005 | Forbes | |
| 6,844,203 B2 | 1/2005 | Ahn et al. | |
| 6,844,319 B1 | 1/2005 | Poelstra et al. | |
| 6,849,948 B2 | 2/2005 | Chen et al. | |
| 6,853,587 B2 | 2/2005 | Forbes | |
| 6,859,093 B1 | 2/2005 | Beigel | |
| 6,863,933 B2 | 3/2005 | Cramer et al. | |
| 6,887,758 B2 | 5/2005 | Chindalore et al. | |
| 6,893,984 B2 | 5/2005 | Ahn et al. | |
| 6,896,617 B2 | 5/2005 | Daly | |
| 6,900,122 B2 | 5/2005 | Ahn et al. | |
| 6,917,112 B2 | 7/2005 | Basceri et al. | |
| 6,921,702 B2 | 7/2005 | Ahn et al. | |
| 6,953,730 B2 | 10/2005 | Ahn et al. | |
| 6,958,302 B2 | 10/2005 | Ahn et al. | |
| 6,960,538 B2 | 11/2005 | Ahn et al. | |
| 6,989,573 B2 | 1/2006 | Ahn et al. | |
| 7,005,697 B2 | 2/2006 | Batra et al. | |
| 7,037,574 B2 | 5/2006 | Paranjpe et al. | |
| 7,037,862 B2 | 5/2006 | Ahn et al. | |
| 7,045,430 B2 | 5/2006 | Ahn et al. | |
| 7,049,192 B2 | 5/2006 | Ahn et al. | |
| 7,067,840 B2 | 6/2006 | Klauk et al. | |
| 7,068,544 B2 | 6/2006 | Forbes et al. | |
| 7,081,421 B2 | 7/2006 | Ahn et al. | |
| 7,084,078 B2 | 8/2006 | Ahn et al. | |
| 7,101,813 B2 | 9/2006 | Ahn et al. | |
| 7,132,329 B1 | 11/2006 | Hong et al. | |
| 7,135,421 B2 | 11/2006 | Ahn et al. | |
| 7,138,336 B2 | 11/2006 | Lee et al. | |
| 7,160,577 B2 | 1/2007 | Ahn et al. | |
| 7,192,824 B2 | 3/2007 | Ahn et al. | |
| 7,432,548 B2 | 10/2008 | Forbes et al. | |
| 7,435,657 B2 | 10/2008 | Shin | |
| 7,482,619 B2 | 1/2009 | Seol et al. | |
| 7,498,230 B2 | 3/2009 | Ahn et al. | |
| 7,517,783 B2 | 4/2009 | Ahn et al. | |
| 7,531,869 B2 | 5/2009 | Ahn et al. | |
| 7,563,730 B2 | 7/2009 | Forbes et al. | |
| 7,575,978 B2 | 8/2009 | Kraus et al. | |
| 8,367,506 B2 | 2/2013 | Ahn et al. | |
| 2001/0012698 A1 | 8/2001 | Hayashi et al. | |
| 2002/0003252 A1 | 1/2002 | Iyer | |
| 2002/0013052 A1 | 1/2002 | Visokay | |
| 2002/0037320 A1 | 3/2002 | Denes et al. | |
| 2002/0046993 A1 | 4/2002 | Peterson et al. | |
| 2002/0187091 A1 | 12/2002 | Deevi | |
| 2002/0190251 A1 | 12/2002 | Kunitake et al. | |
| 2002/0192366 A1 | 12/2002 | Cramer et al. | |
| 2002/0193040 A1 | 12/2002 | Zhou | |
| 2002/0197793 A1 | 12/2002 | Dornfest et al. | |
| 2003/0001190 A1 | 1/2003 | Basceri et al. | |
| 2003/0030074 A1 | 2/2003 | Walker et al. | |
| 2003/0045078 A1 | 3/2003 | Ahn et al. | |
| 2003/0108612 A1 | 6/2003 | Xu et al. | |
| 2003/0143801 A1 | 7/2003 | Basceri et al. | |
| 2003/0148577 A1 | 8/2003 | Merkulov et al. | |
| 2003/0152700 A1 | 8/2003 | Asmussen et al. | |
| 2003/0161782 A1 | 8/2003 | Kim | |
| 2003/0162587 A1 | 8/2003 | Tanamoto et al. | |
| 2003/0183306 A1 | 10/2003 | Hehmann et al. | |
| 2003/0183901 A1 | 10/2003 | Kanda et al. | |
| 2003/0185983 A1 | 10/2003 | Morfill et al. | |
| 2003/0196513 A1 | 10/2003 | Phillips et al. | |
| 2003/0228747 A1 | 12/2003 | Ahn et al. | |
| 2003/0230479 A1 | 12/2003 | Sarkas et al. | |
| 2003/0231992 A1 | 12/2003 | Sarkas et al. | |
| 2003/0234420 A1 | 12/2003 | Forbes | |
| 2003/0235064 A1 | 12/2003 | Batra et al. | |
| 2003/0235066 A1 | 12/2003 | Forbes | |

(56) References Cited

U.S. PATENT DOCUMENTS

| | | |
|---|---|---|
| 2003/0235076 A1 | 12/2003 | Forbes |
| 2004/0009118 A1 | 1/2004 | Phillips et al. |
| 2004/0014060 A1 | 1/2004 | Hoheisel et al. |
| 2004/0042128 A1 | 3/2004 | Slaughter et al. |
| 2004/0043569 A1 | 3/2004 | Ahn et al. |
| 2004/0045807 A1 | 3/2004 | Sarkas et al. |
| 2004/0046130 A1 | 3/2004 | Rao et al. |
| 2004/0051139 A1 | 3/2004 | Kanda et al. |
| 2004/0055892 A1 | 3/2004 | Oh et al. |
| 2004/0058385 A1 | 3/2004 | Abel et al. |
| 2004/0065171 A1 | 4/2004 | Hearley et al. |
| 2004/0086897 A1 | 5/2004 | Mirkin et al. |
| 2004/0094801 A1 | 5/2004 | Liang et al. |
| 2004/0105807 A1 | 6/2004 | Fan et al. |
| 2004/0107906 A1 | 6/2004 | Collins et al. |
| 2004/0110347 A1 | 6/2004 | Yamashita |
| 2004/0126649 A1 | 7/2004 | Chen et al. |
| 2004/0127001 A1 | 7/2004 | Colburn et al. |
| 2004/0130951 A1 | 7/2004 | Forbes |
| 2004/0131795 A1 | 7/2004 | Kuo et al. |
| 2004/0131865 A1 | 7/2004 | Kim et al. |
| 2004/0135951 A1 | 7/2004 | Stumbo et al. |
| 2004/0135997 A1 | 7/2004 | Chan et al. |
| 2004/0144980 A1 | 7/2004 | Ahn et al. |
| 2004/0145001 A1 | 7/2004 | Kanda et al. |
| 2004/0147098 A1 | 7/2004 | Mazen et al. |
| 2004/0149759 A1 | 8/2004 | Moser et al. |
| 2004/0158028 A1 | 8/2004 | Buhler |
| 2004/0160830 A1 | 8/2004 | Forbes |
| 2004/0165412 A1 | 8/2004 | Forbes |
| 2004/0175882 A1 | 9/2004 | Ahn et al. |
| 2004/0202032 A1 | 10/2004 | Forbes |
| 2004/0206957 A1 | 10/2004 | Inoue et al. |
| 2004/0212426 A1 | 10/2004 | Beigel |
| 2004/0214399 A1 | 10/2004 | Ahn et al. |
| 2004/0224505 A1 | 11/2004 | Nguyen et al. |
| 2004/0245085 A1 | 12/2004 | Srinivasan |
| 2004/0258192 A1 | 12/2004 | Angeliu et al. |
| 2004/0266107 A1 | 12/2004 | Chindalore et al. |
| 2005/0007820 A1 | 1/2005 | Chindalore et al. |
| 2005/0011748 A1 | 1/2005 | Beck et al. |
| 2005/0019365 A1 | 1/2005 | Frauchiger et al. |
| 2005/0019836 A1 | 1/2005 | Vogel et al. |
| 2005/0026375 A1 | 2/2005 | Forbes |
| 2005/0031785 A1 | 2/2005 | Carlisle et al. |
| 2005/0035430 A1 | 2/2005 | Beigel |
| 2005/0036370 A1 | 2/2005 | Forbes |
| 2005/0037374 A1 | 2/2005 | Melker et al. |
| 2005/0040034 A1 | 2/2005 | Landgraf et al. |
| 2005/0041455 A1 | 2/2005 | Beigel et al. |
| 2005/0041503 A1 | 2/2005 | Chindalore et al. |
| 2005/0048414 A1 | 3/2005 | Harnack et al. |
| 2005/0048570 A1 | 3/2005 | Weber et al. |
| 2005/0048796 A1 | 3/2005 | Numasawa et al. |
| 2005/0053826 A1 | 3/2005 | Wang et al. |
| 2005/0061249 A1 | 3/2005 | Miyahara et al. |
| 2005/0061785 A1 | 3/2005 | Schroder et al. |
| 2005/0064185 A1 | 3/2005 | Buretea et al. |
| 2005/0151261 A1 | 7/2005 | Kellar et al. |
| 2005/0170089 A1 | 8/2005 | Lashmore et al. |
| 2005/0265063 A1 | 12/2005 | Forbes |
| 2005/0285225 A1 | 12/2005 | Ahn et al. |
| 2006/0024975 A1 | 2/2006 | Ahn et al. |
| 2006/0038179 A1 | 2/2006 | Afzali-Ardakani et al. |
| 2006/0043504 A1 | 3/2006 | Ahn et al. |
| 2006/0046383 A1 | 3/2006 | Chen et al. |
| 2006/0046384 A1 | 3/2006 | Joo et al. |
| 2006/0046522 A1 | 3/2006 | Ahn et al. |
| 2006/0067871 A1 | 3/2006 | Hart et al. |
| 2006/0105523 A1 | 5/2006 | Afzali-Ardakani et al. |
| 2006/0118853 A1 | 6/2006 | Takata et al. |
| 2006/0125030 A1 | 6/2006 | Ahn et al. |
| 2006/0128168 A1 | 6/2006 | Ahn et al. |
| 2006/0140868 A1 | 6/2006 | Grancharov et al. |
| 2006/0148180 A1 | 7/2006 | Ahn et al. |
| 2006/0176645 A1 | 8/2006 | Ahn et al. |
| 2006/0177975 A1 | 8/2006 | Ahn et al. |
| 2006/0189154 A1 | 8/2006 | Ahn et al. |
| 2006/0194438 A1 | 8/2006 | Rao et al. |
| 2006/0223337 A1 | 10/2006 | Ahn et al. |
| 2006/0228868 A1 | 10/2006 | Ahn et al. |
| 2006/0231889 A1 | 10/2006 | Chen et al. |
| 2006/0244082 A1 | 11/2006 | Ahn et al. |
| 2006/0244100 A1 | 11/2006 | Ahn et al. |
| 2006/0252202 A1 | 11/2006 | Dai et al. |
| 2006/0263972 A1 | 11/2006 | Ahn et al. |
| 2006/0270147 A1 | 11/2006 | Ahn et al. |
| 2006/0273411 A1 | 12/2006 | Triyoso et al. |
| 2006/0281330 A1 | 12/2006 | Ahn et al. |
| 2007/0018214 A1 | 1/2007 | Ahn |
| 2007/0018342 A1 | 1/2007 | Sandhu et al. |
| 2007/0048790 A1 | 3/2007 | Sheetz et al. |
| 2007/0048926 A1 | 3/2007 | Ahn |
| 2007/0048989 A1 | 3/2007 | Ahn et al. |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059645 A1 | 3/2007 | Tang et al. |
| 2007/0059775 A1 | 3/2007 | Hultman et al. |
| 2007/0092989 A1 | 4/2007 | Kraus et al. |
| 2007/0140951 A1 | 6/2007 | O'Brien et al. |
| 2007/0228442 A1 | 10/2007 | Kakimoto |
| 2007/0228526 A1 | 10/2007 | Shimizu et al. |
| 2007/0287261 A1 | 12/2007 | Raaijmakers et al. |
| 2008/0003615 A1 | 1/2008 | Sheetz et al. |
| 2008/0069760 A1 | 3/2008 | O'Brien et al. |
| 2008/0110486 A1 | 5/2008 | Tsakalakos et al. |
| 2008/0157171 A1 | 7/2008 | Majhi et al. |
| 2008/0217159 A1* | 9/2008 | Takeda et al. .............. 204/155 |
| 2008/0224115 A1 | 9/2008 | Bakkers et al. |
| 2008/0246114 A1 | 10/2008 | Abrokwah et al. |
| 2008/0296650 A1 | 12/2008 | Ahn et al. |
| 2009/0075035 A1 | 3/2009 | O'Brien et al. |
| 2009/0236655 A1* | 9/2009 | Choi et al. .............. 257/325 |
| 2010/0055830 A1* | 3/2010 | Chen et al. .............. 438/102 |

OTHER PUBLICATIONS

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Ahn, K Y, "ALD of Silicon Films on Germanium", U.S. Appl. No. 11/498,576, filed Aug. 3, 2006.

Ahn, K Y, "Atomic Layer Deposited Barium Strontium Titanium Oxide Films", U.S. Appl. No. 11/510,803, filed Aug. 26, 2006.

Ahn, K Y, "Deposition of ZrAlON Films", U.S. Appl. No. 11/498,578, filed Aug. 3, 2006.

Ahn, Kie Y, "Conductive Layers for Hafnium Silicon Oxynitride Films", U.S. Appl. No. 11/355,490, filed Feb. 16, 2006, (Client Ref. No. 05-0987).

Ahn, Kie Y, "Gallium Lanthanide Oxide Films", U.S. Appl. No. 11/329,025, filed Jan. 10, 2006.

Ahn, Kie Y, et al., "Hafnium Lanthanide Oxynitride Films", U.S. Appl. No. 11/515,143, filed Aug. 31, 2006.

Ahn, Kie Y, "Hafnium Tantalum Titanium Oxide Films", U.S. Appl. No. 11/297,741, filed Dec. 8, 2005, 05-0782.

Ahn, Kie Y, et al., "Lanthanide Yttrium Aluminum Oxide Dielectric Films", U.S. Appl. No. 11/297,567, filed Dec. 8, 2005, 05-0711.

Ahn, Kie Y, et al., "Methods to Form Dielectric Structures in Semiconductor Devices and Resulting Devices", U.S. Appl. No. 11/581,675, filed Aug. 16, 2006.

Ahn, Kie Y, et al., "Tantalum Lanthanide Oxynitride Films", U.S. Appl. No. 11/514,545, filed Aug. 31, 2006.

Appenzeller, J, et al., "Carbon nanotubes as potential building blocks for future nanoelectronics", Microelectronic Engineering, 64(1), (Aug. 6, 2002), 391-397.

Banerjee, Sarbajit, et al., "Controlled Dielectrophoretic Positioning of Carbon Nanotubes", American Physical Society, March Meeting, Session U31: Nanotubes, Experiment, (Mar. 16, 2006), 1 pg.

(56) References Cited

OTHER PUBLICATIONS

Banerjee, Sarbajit, et al., "Controlling the dielectrophoretic assembly of single-walled carbon nanotubes", American Physiological Society, March Meeting, Session X31: Synthesis of Nanotubes and Nanowires, (Mar. 5, 2007), 1 pg.

Banerjee, Sarbajit, et al., "Precise positioning of single-walled carbon nanotubes by ac dielectrophoresis", The Journal of Vacuum Science and Technology B, 24(6), (Dec. 4, 2006), 3173-3178.

Chen, Zhihong, et al., "An Integrated Logic Circuit Assembled on a Single Carbon Nanotube", Science, 311, (Mar. 24, 2006), p. 1735.

Conley, J. F, "Atomic Layer Deposition of Hafnium Oxide Using Anhydrous Hafnium Nitrate", Electrochemical and Solid-State Letters, 5(5), (May 2002), C57-C59.

De Poortere, E P, et al., "1 to 2-nm-wide nanogaps fabricated with single-walled carbon nanotube shadow masks", Journal of Vacuum Science Technology B, 24(6), (Dec. 4, 2006), 3213-3216.

De Poortere, E P, et al., "Single-Walled Carbon Nanotubes as Shadow Masks for Nanogap Junction Fabrication", Applied Physics Letters, 88, (Apr. 6, 2006), 1-4.

Forbes, "Hafnium Aluminium Oxynitride High-K Dielectric and Metal Gates", U.S. Appl. No. 11/514,558, filed Aug. 31, 2006.

Forbes, "Hafnium Tantalum Oxynitride High-K Dielectric and Metal Gates", U.S. Appl. No. 11/515,114, filed Aug. 31, 2005.

Forbes, et al., "Tantalum Aluminum Oxynitride High-K Dielectric and Metal Gates", U.S. Appl. No. 11/514,655, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006.

Guo, Xuefeng, et al., "Covalently Bridging Gaps in Single-Walled Carbon Nanotubes with Conducting Molecules", Science, 311, (Jan. 20, 2006), 356-359.

Guo, Xuefeng, et al., "Directing and Sensing Changes in Molecular Conformation on Individual Carbon Nanotube Field Effect Transistors", Journal of the American Chemical Society, 127(43), (Nov. 2, 2005), 15045-15047.

Hata, K., et al., "Water-Assisted Highly Efficient Synthesis of Impurity-Free Single-Walled Carbon Nanotubes", Science, 306, (Nov. 19, 2004), 1362-1364.

Huang, Limin, et al., "Barium Titanate Nanocrystals and Nanocrystal Thin Films: Synthesis, Ferroelectricity, and Dielectric Properties", Journal of Applied Physiology 100, 034316, (Aug. 10, 2006), 9 pgs.

Huang, Limin, et al., "Cobalt Ultrathin Film Catalyzed Ethanol Chemical Vapor Deposition of Single-Walled Carbon Nanotubes", Journal of Physiological Chemistry B, 110, (Mar. 27, 2006), 11103-11109.

Huang, Limin, et al., "Controlled Growth of Single-Walled Carbon Nanotubes from an Ordered Mesoporous Silica Template", Nano Letters, 3 (3), (Feb. 5, 2003), 299-303.

Huang, Limin, et al., "Long and Oriented Single-Walled Carbon Nanotubes Grown by Ethanol Chemical Vapor Deposition", The Journal of Physical Chemistry B, 108(43), (Sep. 29, 2004), 16451-16456.

Huang, Shaoming, et al., "Growth Mechanism of Oriented Long Single Walled Carbon Nanotubes Using 'Fast-Heating' Chemical Vapor Deposition Process", Nano Letters, 4(6), (May 1, 2004), 1025-1028.

Huang, Xue M. H., et al., "Controlled Placement of Individual Carbon Nanotubes", Nano Letters, 5(7), (Jun. 18, 2005), 1515-1518.

Kolliopoulou, S, et al., "Hybrid silicon-organic nanoparticle memory device", Journal of Applied Physics, 94(8), (2003), 5234-5239.

Krauss, Todd D, et al., "Charge and Photoionization Properties of Single Semiconductor Nanocrystals", The Journal of Physical Chemistry B, 105(9), (2001), 1725-1733.

Kukli, Kaupo, "Comparison of hafnium oxide films grown by atomic layer deposition from iodide and chloride precursors", Thin Solid Films, 416, (2002), 72-79.

Lee, C., et al., "Self-Assembly of Metal Nanocrystals on Ultrathin Oxide for Nonvolatile Memory Applications", J. Elect. Mater; vol. 34(1), (Jan. 2005), 1-11.

Leskela, M, "ALD precursor chemistry: Evolution and future challenges", Journal de Physique IV (Proceedings), 9(8), (Sep. 1999), 837-852.

Liu, Zengtao, et al., "Metal nanocrystal memories. I. Device design and fabrication", IEEE Transactions on Electron Devices, 49(9), (Sep. 2002), 1606-1613.

Muller, D. A., et al., "The Electronic Structure at the Atomic Scale of Ultrathin Gate Oxides", Nature, 399, (Jun. 1999), 758-761.

Nakajima, Anri, et al., "NH/sub 3/-annealed atomic-layer-deposited silicon nitride as a high-k gate dielectric with high reliability", Applied Physics Letters, 80(7), (Feb. 2002), 1252-1254.

Nalwa, H. S, "Handbook of Thin Film Materials", Deposition and Processing of Thin Films, vol. 1, San Diego : Academic Press, (2002), 114-119.

O'Brien, Stephen, et al., "Adsorption Dynamics of Alkanes on Single-Wall Carbon Nanotubes: A Molecular Beam Scattering Study", The Journal of Physical Chemistry C, 111(22), (May 11, 2007), 8043-8049.

O'Brien, Stephen, et al., "Synthesis of Monodisperse Nanoparticles of Barium Titanate: Toward a Generalized Strategy of Oxide Nanoparticle Synthesis", Journal of the American Chemical Society, 123, (Nov. 7, 2001), 12085-12086.

Redi, F X, et al., "Three-dimensional binary superlattices of magnetic nanocrystals and semiconductor quantum dots", Nature, 423, (Jun. 26, 2003), 968-971.

Sargentis, CH, et al., "Fabrication and characterization of a metal nanocrystal memory using molecular beam epitaxy", J. Phys.: Conf. Ser., 10, (2005), 53-56.

Sargentis, CH., et al., "Deposition and electrical characterisation of a MOS memory structure containing AU nanoparticles in a high-k dielectric layer", Semiconductor Device Research Symposium, 2005, (Dec. 7, 2005), 342-343.

Sargentis, CH., et al., "Synthesis and electrical characterization of a MOS Memory Containing Pt Nanoparticles Deposited at a SiO2 / HfO2 Interface", Mater. Res. Soc. Symp. Proc., 830, (2005), D6.4.1-D6.4.6.

Sfeir, Matthew J, "Optical Spectroscopy of Individual Single-Walled Carbon Nanotubes of Defined Chiral Structure", Science, 312(5773), (Apr. 28, 2006), 554-556.

Sfeir, Matthew J, et al., "Probing Electronic Transitions in Individual Carbon Nanotubes by Rayleigh Scattering", Science, 306(5701), (Nov. 26, 2004), 1540-1543.

She, Min, et al., "Modeling and design study of nanocrystal memory devices", IEEE Device Research Conference, (2001), 139-40.

Shevchenko, Elena V, et al., "Structural Diversity in Binary Nanoparticle Superlattices", Nature, 439, (Jan. 5, 2006), 55-59.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", Advanced Materials for Optics and Electronics, 10(3-5), (2000), 105-114.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Somorjai, "Introduction to surface chemistry and catalysis", (1994), 336-337.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Tan, Zerlinda, et al., "Self-assembly of Ni nanocrystals on HfO2 and N-assisted Ni confinement for non-volatile memory application", Applied Physics Letters, 86, (2005), 13107-1 to 13107-3.

Wang, Feng, et al., "Interactions between Individual Carbon Nanotubes Studied by Rayleigh Scattering Spectroscopy", Physical Review Letters, 96, (Apr. 28, 2006), 167401-1 through 167401-4.

Wang, Q, "Synthesis and electron storage characteristics of isolated silver nanodots on/embedded in Al2O3 gate dielectric", Applied Surface Science, 230, (2004), 8-11.

Wilk, G. D., "High-K gate dielectrics: Current status and materials properties considerations", Journal of Applied Physics, 89(10), (May 2001), 5243-5275.

(56) References Cited

OTHER PUBLICATIONS

Wind, S J, et al., "Carbon nanotube devices for future nanoelectronics", Third IEEE Conference on Nanotechnology, Aug. 12-14, 2003, 1(2), (Aug. 2003), 236-239.

Wind, S S, et al., "Fabrication and electrical characterization of top gate single-wall carbon nanotube field-effect transistors", Journal of Vacuum Science and Technology B: Microelectronics and Nanometer Structures, 20(6), (Nov. 2002), 2798-2801.

Xiaoli, Yuan, "Effects of interface traps in silicon-quantum-dots-based memory structures", Physica E, 8(2), (Aug. 2000), 189-193(5).

Yin, M., et al., "Synthesis of Monodisperse Nanocrystals of Manganese Oxide", Journal of the American Chemical Society, 125(34), (May 21, 2003), 10180-10181.

Zhang, H., "Atomic layer deposition of high dielectric constant nanolaminates", Journal of the Electrochemical Society, 148(4), (Apr. 2001), F63-F66.

\* cited by examiner

HIGH-K DIELECTRICS WITH GOLD NANO-PARTICLES

RELATED APPLICATION

This is a divisional of U.S. patent application Ser. No. 11/810,004, filed Jun. 4, 2007, that is incorporated herein by reference in its entirety.

TECHNICAL FIELD

This disclosure relates generally to semiconductor devices and device fabrication, including device dielectric layers and methods of fabrication.

BACKGROUND

Certain non-volatile memory devices may operate by trapping charges in a dielectric interface to adjust the threshold voltage of a transistor and thus program the desired digital value of the transistor. One method of trapping charges is found in nonvolatile flash devices that use a floating gate electrode layer placed between a tunnel oxide layer and a control oxide layer to trap charges under the influence of a control gate electrode.

Such non-volatile memory devices may have a reliability problem with controlling current carrier flow through the dielectric layers from electrode to electrode due to the very thin physical thickness of the dielectric layers used to obtain rapid current flow at reasonable voltage levels. For example, in a floating gate memory the top and bottom surfaces of each insulator layer may be in contact with a conductive surface since each insulator layer may be located between solid conductive electrodes such as the substrate, the floating gate, and the control gate. Thus, a defect in either insulator layer may cause a device failure in a floating gate device. Charge trapping type non-volatile devices such as NROMs and NMOS devices use a change in dielectric properties to create a layer of charge carriers, typically with an oxide-nitride-oxide (ONO) arrangement of three dielectric layers. This arrangement is less sensitive to dielectric defects in one of the three dielectric layers, but may have an issue with the programming and erasing voltage levels used to obtain reasonable read and write speeds. It may also be difficult to obtain smooth surfaces with the tendency of each one of three dielectric depositions to accentuate the particles and non-uniformities of the previous layer, which may result in electric field concentration and increased time dependent dielectric breakdown.

The above noted issues of dielectric defect levels may become even more of an issue in the future, since the semiconductor device industry has a need to continue to reduce the size of semiconductor devices such as transistors to obtain lower power consumption and higher performance. In general, to reduce transistor size, the thickness of the silicon dioxide ($SiO_2$) gate dielectric is reduced in proportion to the shrinkage of the gate length. For example, a metal-oxide-semiconductor field effect transistor (MOSFET) might use a 1.5 nm thick $SiO_2$ gate dielectric for a gate length of 70 nm. An industry goal is to fabricate smaller, more reliable integrated circuits (ICs) for use in products such as processor chips, mobile telephones, and memory devices such as dynamic random access memories (DRAMs).

The semiconductor industry relies on the ability to reduce the dimensions of its basic devices, generally known as scaling, to increase performance, decrease power consumption, and decrease product costs, for example the silicon based MOSFET. This device scaling includes scaling the gate dielectric, which has primarily been fabricated using silicon dioxide. This is because thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have indicated a need to use other dielectric materials as gate dielectrics, in particular dielectrics with higher dielectric constants (high-k) to replace the use of various combinations of $SiO_2$, $Si_3N_4$ and SiON. For these higher dielectric constant materials to be practical they must have the properties of high permittivity, thermal stability, high film and surface quality and smoothness, hysteresis characteristics, leakage current density, and long term reliability.

High-k layers may be formed of metal oxide unary materials such as $Al_2O_3$, $CeO_2$, $HfO_2$ and $ZrO_2$, which have a single metallic component. High-k dielectric layers may be formed as binary systems such as $(Y_2O_3)_x(ZrO_2)_{1-x}$, $LaAlO_3$, and $(HfO_2)(Al_2O_3)$, which have two metallic components, and so on. High-k layers may be formed in single layers, or may be formed of multiple layers of different materials that act as a composite material. The high-k materials are preferably in an amorphous state, which may result in better surface smoothness (which may reduce electric field concentration at sharp projections), and may reduce leakage current along crystal boundaries. Thus, there is a need in the industry to form high-k layers that possess the above noted features and are practical for use in manufacturing integrated circuits (ICs).

DETAILED DESCRIPTION

Figure 1:
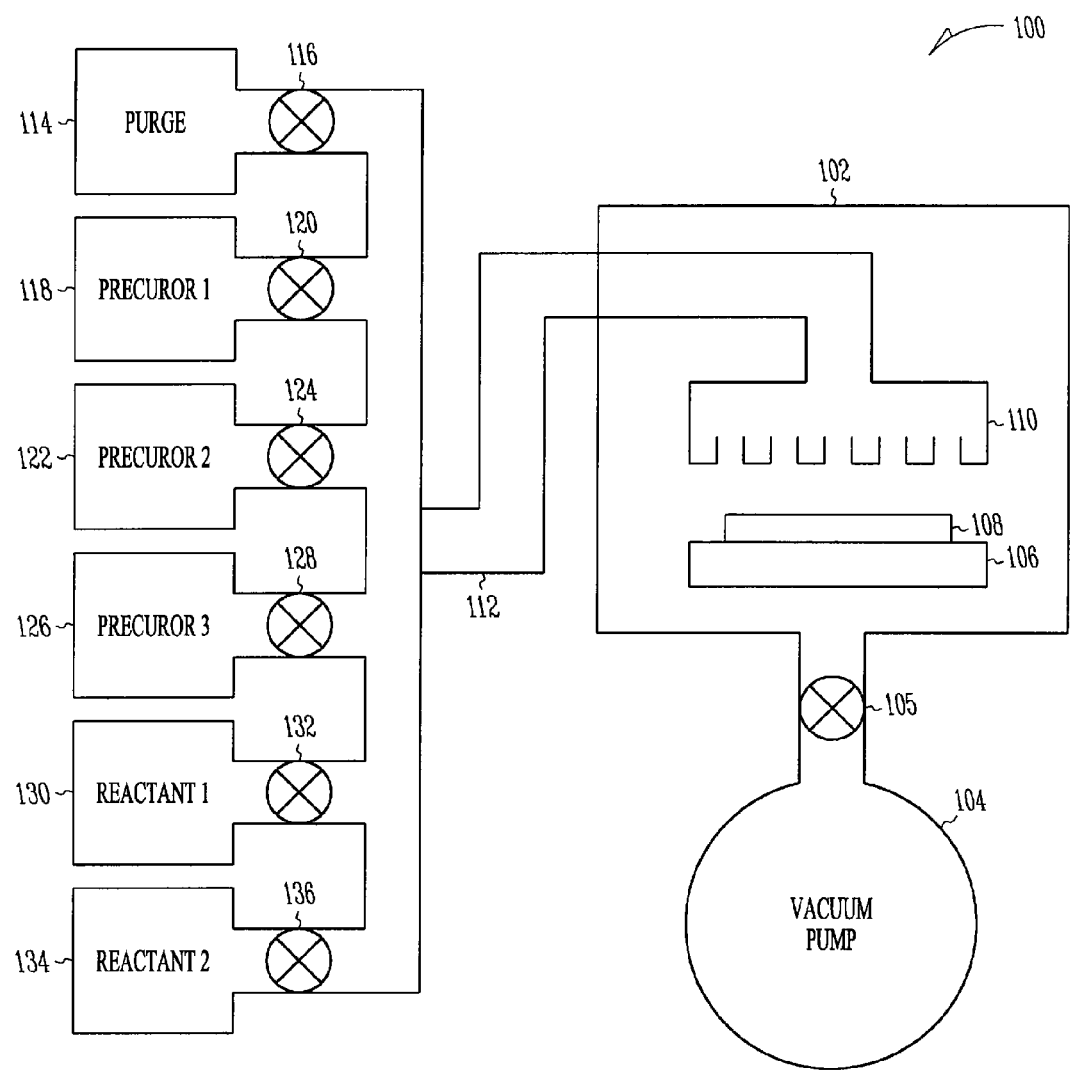
FIG. 1 illustrates an electronic device according to various embodiments of the invention.

The following detailed description refers to the accompanying drawings that show, by way of illustration, specific embodiments in which the present invention may be practiced. These embodiments are described in sufficient detail to enable those skilled in the art to practice the present invention. Other embodiments may be used and structural, logical, and electrical changes may be made without departing from the present invention. The various embodiments are not necessarily mutually exclusive, as some embodiments can be combined with one or more other embodiments to form new embodiments.

The terms "wafer" and "substrate" as used in the following description may include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art. The term "conductor" is understood to generally include n-type and p-type semiconductors and the term "insulator" or "dielectric" is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the present invention is defined only by the appended claims, along with the full range of equivalents to which such claims are entitled.

The two issues discussed above of dielectric integrity and charge trapping efficiency may be addressed by the use of nano-particles of conductive materials at an interface of two dielectric materials. An analogy might be to think of the layer of nano-particles as replacing the floating gate electrode in a flash device. By selecting material used for the nano-particles, and thus the work function, the efficiency of charge carrier transfer through the dielectric layers may be adjusted to improve performance. The issue of reducing and scaling the size of the overall transistor may be addressed by increasing the dielectric constant of one or more of the dielectric layers, since an increase in the dielectric constant by a factor of two results in twice as much capacitive coupling between the gate electrode and the channel region. In effect, doubling the dielectric constant on a specific thickness dielectric layer results in a gate that operates as if it had a dielectric layer that was half the thickness, which results in improved device performance.

A gate dielectric in a transistor has both a physical gate dielectric thickness and an equivalent oxide thickness (EOT or $t_{eq}$). The equivalent oxide thickness (EOT) quantifies the electrical properties, such as capacitance, of the high-k gate dielectric in terms of a representative physical thickness of a silicon dioxide gate dielectric. The term $t_{eq}$ is defined as the thickness of a theoretical $SiO_2$ layer that would be needed to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 0.3 to 0.6 nm larger than the physical $SiO_2$ thickness, t. Thus, with the semiconductor industry moving to scale the gate dielectric equivalent oxide thickness to under 1.0 nm, the physical thickness requirement for a $SiO_2$ layer used for a gate dielectric would need to be approximately 0.4 to 0.7 nm.

Additional requirements for a $SiO_2$ gate dielectric layer may depend on the properties of the gate electrode used in conjunction with the $SiO_2$ gate dielectric. Using a conventional polysilicon gate would result in an additional increase in $t_{eq}$ for the $SiO_2$ layer. This additional thickness may be reduced by using a metal gate electrode, though metal gates are not currently used in typical complementary metal-oxide-semiconductor (CMOS) field effect transistor technology. Thus, future devices may require a physical $SiO_2$ gate dielectric layer of about 0.5 nm or less. Such a small thickness requirement for a $SiO_2$ oxide layer creates additional problems such as current leakage across the thin dielectric.

Silicon dioxide is commonly used as a gate dielectric due to its electrical isolation properties in a $SiO_2$—Si based structure. This electrical isolation is due to the relatively large band gap of $SiO_2$ (8.9 eV), making it a good electrical insulator. Significant reductions in its band gap would cause $SiO_2$ to become a poor material for a gate dielectric. As the thickness of a $SiO_2$ layer decreases, the number of atomic layers, or monolayers of the material decreases. At a certain thickness the number of monolayers will be sufficiently few that the $SiO_2$ layer will not have as complete an arrangement of atoms as found in a thicker (known as bulk) layer. As a result of incomplete formation relative to a bulk structure, a thin $SiO_2$ layer of only one or two monolayers will not form a full band gap. Lack of a full band gap in a $SiO_2$ gate dielectric may cause an effective short between an underlying conductive silicon channel and an overlying polysilicon gate. This undesirable property sets a limit on the minimum physical thickness to which a $SiO_2$ layer can be scaled. The minimum thickness due to this monolayer effect is thought to be about 0.7 nm. Therefore, for future devices to have a $t_{eq}$ less than about 1.0 nm, dielectrics other than $SiO_2$ need to be considered for use as a gate dielectric.

For a typical dielectric layer used as a gate dielectric, the capacitance is determined as in a parallel plate capacitance: $C=k\in_0 A/t$, where k is the dielectric constant, $\in_0$ is the permittivity of free space, A is the area of the capacitor, and t is the thickness of the dielectric. The thickness, t, of a material is related to its $t_{eq}$ for a given capacitance, with $SiO_2$ having a dielectric constant $k_{ox}=3.9$, as $$t=(k/k_{ox})t_{eq}=(k/3.9)t_{eq}.$$

Thus, materials with a dielectric constant greater than that of $SiO_2$, (about 3.9), will have a physical thickness that may be larger than a desired $t_{eq}$, while providing the desired equivalent oxide thickness. For example, a dielectric material with a dielectric constant of 10, such as $Al_2O_3$, could have a thickness of about 25.6 Å to provide a $t_{eq}$ of 1.0 nm, not including any depletion or inversion layer effects. Thus, a reduced equivalent oxide thickness for transistors can be realized by using dielectric materials with higher dielectric constants than $SiO_2$.

The thinner equivalent oxide thickness (EOT) desired for lower transistor operating voltages and smaller transistor dimensions may be realized by a significant number of materials, but additional fabricating requirements make determining a suitable replacement for $SiO_2$ difficult. The current view for the future of the microelectronics industry still predicts silicon based devices. This requires that the gate dielectric employed be grown on a silicon substrate or silicon layer, which places constraints on substitute dielectric materials.

During the formation of the dielectric on the silicon layer, there exists the possibility that a small layer of $SiO_2$ may be formed in addition to the desired dielectric. The result would effectively be a dielectric layer consisting of two sub-layers in parallel with each other and with the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO_2} + (k_{ox}/k)_t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. Thus a desirable feature of the new higher constant dielectric would be an oxygen barrier to prevent a layer of $SiO_2$ from forming on the silicon surface. Whether a single dielectric layer with a high dielectric constant or a barrier layer with a higher dielectric constant than $SiO_2$ is employed, the layer directly in contact with or interfacing with the silicon layer must provide a high quality interface to maintain high channel carrier mobility.

One of the benefits of using $SiO_2$ as a gate dielectric has been that the formation of the $SiO_2$ layer results in an amorphous gate dielectric. Having an amorphous structure for a gate dielectric provides reduced leakage current problems associated with grain boundaries in polycrystalline gate dielectrics, which may cause high leakage paths. Grain size and orientation changes throughout a polycrystalline gate dielectric may cause variations in the film's dielectric constant, along with uniformity and surface topography problems, such as non-uniformity and roughness. Typically, materials having a high dielectric constant relative to $SiO_2$ also have the disadvantage of existing in a crystalline form, at least in a bulk configuration. The best candidates for replacing $SiO_2$ as a gate dielectric are those with high dielectric constants, which can be fabricated as a thin layer with an amorphous form that can remain amorphous during the thermal cycles typically found in semiconductor production after the growth of the gate dielectric, such as gate electrode growth, metal deposition, and annealing operations. Tin oxides, such as $SnO_2$, when alloyed with other oxides have been shown to raise the oxide crystallization temperature, and thus stabilize the long term interfacial characteristics of the amorphous dielectric at temperatures up to 1000° C.

Candidates to replace $SiO_2$ include materials with high dielectric constants (high k), a large energy gap ($E_g$), large energy barrier heights with the silicon substrate for both electrons and holes, and an amorphous nature that resists crystallization during the thermal cycling typically found in semiconductor manufacturing. High dielectric constant materials may be defined as having a dielectric constant greater than about twice the dielectric constant of silicon dioxide. Generally, the band gap is inversely related to the dielectric constant for a high k material, which lessens some benefits of the high dielectric constant material because of the potential leakage. High dielectric constant dielectric candidates for replacing silicon oxide as the dielectric material in electronic components in integrated circuits include the lanthanide oxides such as $Gd_2O_3$, $Ce_2O_3$, $La_2O_3$, $Pr_2O_3$, $Nd_2O_3$, $Sm_2O_3$, $Dy_2O_3$, $Tb_2O_3$, $Er_2O_3$, $Eu_2O_3$, $Lu_2O_3$, $Tm_2O_3$, $HO_2O_3$, $Pm_2O_3$, and $Yb_2O_3$. Other candidates include various lanthanide silicates, titanium oxide $TiO_2$, hafnium oxide $HfO_2$, and zirconium oxide, $ZrO_2$. Such high dielectric constant layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere and other particles cause damage. High energy impacts remove body region particles creating pits. The surface of such a deposited layer may have a rough contour due to the rough interface at the body region, and thus the electrical properties of a thin film may not be as good as the values in a bulk sample of the same material. Thus the method with which the thin film dielectric is deposited may have a substantial affect on the usefulness of the material in electronic devices. The use of atomic layer deposition (ALD) may provide smoother surfaces than sputtering, without the need to do a separate oxidation as may be found in evaporation processes. ALD may also be performed at a reduced temperature to reduce the presence of the silicon dioxide layer on the silicon surface without the need for a barrier layer.

Few materials meet all the requirements of a proper gate dielectric, such as chemical/structural stability in contact with silicon at high temperatures such as are found in semiconductor processing, a large bandgap and conduction band/valence band offsets to silicon, a high k value, and the ability to remain amorphous during fabrication thermal cycles. Hafnium oxide ($HfO_2$), a widely studied material, has a dielectric constant of about 20, a bandgap of around 5.6 eV, and conduction band/valence band offsets versus silicon of 2.0 eV/2.5 eV. A potential issue with hafnium oxide is that oxygen may diffuse through the hafnium oxide during subsequent furnace operations and form a $SiO_2$ layer underneath the hafnium oxide at the silicon interface, resulting in reduced capacitive coupling between the gate electrode and the semiconductor. The leakage across the dielectric film ranges between $10^{-7}$ A/cm² to $1.0 \times 10^{-9}$ A/cm², depending upon the composition, which may form useful dielectric layers for semiconductor device gate insulators. The use of an atomic layer deposition (ALD) $Hf_YO_2$ film, where $0.5 < Y < 2.0$, may have a selectable dielectric constant ranging from 15 to 22 depending primarily upon the value of Y and on the deposition temperature.

A 10 nm thick layer of hafnium oxide would have an equivalent oxide thickness (EOT) of about 2.0 nm, but being much thicker that the equivalent layer of silicon dioxide would have much lower leakage currents. The use of ALD results in dielectric layers grown on silicon surfaces having improved surface smoothness of around 0.10 nm root mean square (RMS) value on a 10 nm thick layer, resulting in less electric field concentration at insulator corners and projections, and again lower leakage currents. Further, forming such a dielectric film using atomic layer deposition can provide for controlling transitions between different material layers. As a result of such control, ALD deposited dielectric films may have an engineered transition with a substrate surface, or may be formed of many thin layers of different dielectric materials to enable selection of the dielectric constant to a value that is between the values obtainable from pure dielectric compounds.

At this point a general discussion of atomic layer deposition will now be given, because the properties of ALD processes affect the properties of the final dielectric and other material layers. ALD, which may be known as atomic layer epitaxy (ALE), is a modification of chemical vapor deposition (CVD) and may also be called "alternatively pulsed-CVD," or "sequentially pulsed-CVD." In ALD, gaseous precursors are introduced one at a time to the substrate surface mounted within a reaction chamber (or reactor). This introduction of the gaseous precursors takes the form of individual pulses of each gaseous precursor. In a pulse of a precursor gas, the precursor gas is made to flow into a specific area or region for a short period of time. Between the pulses, the reaction chamber is purged with a gas, which in many cases is an inert gas, and may also be evacuated prior to the next step.

In the first reaction step of the ALD process, the first precursor saturates and is chemisorbed (or adsorbed) at the substrate surface during the first pulsing phase. Subsequent pulsing with a purging gas removes excess precursor from the reaction chamber, specifically the precursor that has not been chemisorbed.

The second pulsing phase introduces a second precursor chemical (which may also be known as a reactant chemical) to the substrate where the growth reaction of the desired film takes place, with a reaction thickness that depends upon the amount of chemisorbed first precursor. Subsequent to the film growth reaction, reaction byproducts and precursor excess are purged from the reaction chamber. With a precursor chemistry where the precursors adsorb and aggressively react with each other on the substrate, one ALD cycle can be performed in less than one second in a flow type reaction chamber. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. ALD provides for controlling film thickness in a straightforward manner by controlling the number of growth cycles.

ALD was originally developed to manufacture luminescent and dielectric films needed in electroluminescent displays, such as doped zinc sulfide and alkaline earth metal sulfide films. ALD can also grow different epitaxial II-V and II-VI films, non-epitaxial crystalline or amorphous oxide and nitride films, pure metal layers, alloy metal layers, and nanometer thick individual layers stacked in a multilayer structure, which may be known as a nanolaminant.

The precursors used in an ALD process may be gaseous, liquid or solid; however, liquid or solid precursors should be volatile with a vapor pressure high enough for effective mass transportation. In addition, solid and some liquid precursors may need to be heated inside the reaction chamber and introduced through heated tubes to the substrates. The desired vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary during the process because of changes in solid surface area.

The precursors used in ALD should be thermally stable at the substrate temperature because their decomposition would destroy the surface control and accordingly the benefit of the ALD method that relies on the reaction of the precursor at the substrate surface. A slight decomposition, if slow compared to the ALD growth, can be tolerated.

The precursors should chemisorb on, or react with, the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The ability to use highly reactive precursors in ALD contrasts with the selection of precursors for conventional CVD type reactions. The by-products in the reaction should be gaseous to allow their easy removal from the reaction chamber during a purge stage. Further, the by-products should not react or adsorb on the surface.

In an ALD process, the self-limiting process sequence involves sequential surface chemical reactions. ALD relies on chemistry between a reactive surface and one or more reactive molecular precursors, which are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in equal metered sequences that are all identical in chemical kinetics, deposition per cycle, composition, and thickness. ALD sequences generally deposit less than a full layer per cycle. Typically, a deposition or growth rate of about 0.25 to 2.00 Å per cycle can be realized.

The benefits of ALD depositions over other deposition techniques, such as CVD, include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. ALD processes allow for deposition control on the order of single monolayers and the ability to deposit amorphous films.

A cycle of a deposition sequence includes pulsing a first precursor material, pulsing a purging gas for the precursor, pulsing a second reactant precursor, and pulsing the reactant's purging gas, resulting in a very consistent deposition thickness that depends upon the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the reactant's purging gas. The resulting thin layers of different dielectric materials, frequently only a few molecular layers thick, may be known as a nanolaminate. A nanolaminate means a composite film of ultra thin layers of two or more different materials in a layered stack, where the layers are alternating layers of the different materials having a thickness on the order of a nanometer, and may be a continuous film a single monolayer thick of the material. The nanolayers are not limited to alternating single layers of each material, but may include several layers of one material alternating with a single layer of the other material, to obtain a desired ratio of the two or more materials. Such an arrangement may obtain a dielectric constant that is between the values of the two materials taken singly. The dielectric layer may be formed of single layers of the two or more materials deposited individually, but the overall layer may act as a single film formed of an alloy of the individual films. This may depend upon the particular materials being used and their physical and chemical properties relative to one another. If the materials are miscible, the result may be a single dielectric layer or alloy.

Thus, the use of ALD in the formation of non-volatile memory devices, or any semiconductor structure, may provide a high level of thickness control, improved surface flatness and smoothness, and engineered or continuously varying layer compositions.

Nano-particle devices may be used to replace a single floating gate electrode in a nonvolatile memory, such as a flash memory, to address the reliability issues with multiple dielectric layers separating two or more conductive electrodes. The material of the nano-particles may be chosen to adjust the work function desired for moving electrons or holes across the metal oxide layers, and the equivalent oxide thickness (EOT) of the overall dielectric layer may be reduced, as compared to the two insulator layers found in flash devices (i.e., one below the floating gate electrode and one between the floating gate and the control gate electrode). A lower EOT may result in faster devices having increased reliability, due to less reliance on physically thin insulator layers.

In a typical floating gate memory each one of the two surfaces of each insulator layer may be in contact with a conductive surface, since each insulator layer may be located between solid conductive layers such as the substrate, the floating gate, and the control gate, so that a single defect in either insulator layer may cause a device failure in a floating gate device. By contrast, metal oxide layer defects may have less effect in a nano-particle device since the insulators may be in contact with each other between the nano-particles and since the nano-particle layer may not be continuous. Nano-particles have diameters in the nanometer range.

When transistor dimensions are scaled downward, the properties of a nonvolatile memory transistor tend to follow those of a volatile transistor, including operating faster and with lower total power dissipation, with lower threshold and operating voltages. By forming a shorter channel length for the signal to traverse, the time the signal carriers (either electrons or holes) spend in the channel region decreases and the speed of the transistor increases. Reducing the lateral dimensions of a transistor also increases the electric field strength that the signal carriers encounter, which may result in faster carrier velocity and increased transistor speed; a lower operating voltage may sometimes also be used. Reducing the vertical dimensions of a transistor, such as the gate insulator (for example a silicon dioxide) thickness, also tends to increase the electric field strength at a selected gate voltage, which may lower the threshold voltage for the transistor, which may in turn increase the channel conductance, as well as increasing transistor reliability. However, reducing the gate insulator thickness may also result in defective devices and poor insulator properties with increased leakage.

It is sometimes possible to reduce the effective gate insulator thickness without reducing the physical gate insulator thickness. Thus, in many embodiments, improved electrical properties may be obtained without incurring the potential gate insulator defects or increased leakage current by the use of gate insulators having a larger dielectric constant than found in silicon dioxide.

An embodiment of a method to form a semiconductor device that is less sensitive to dielectric defect levels, has improved charge storage efficiency, and is more easily reduced in dimension may include comprising forming a dielectric layer having a layer of a high work function metal and a layer of a metal oxide on a surface of a substrate, and forming a conductive layer on the dielectric layer, to complete the formation of an active device. The method may include forming the dielectric layer using atomic layer deposition to obtain a smoother and more uniform surface and a more accurate layer thickness. There may be dielectric layer, a silicon oxide layer below the metal oxide layer, and metal layer to provide a superior semiconductor interface due to the high bandgap of silicon oxides, such as silicon dioxide. The metal oxide may include a metal selected from titanium (Ti), zirconium (Zr) and Hafnium (Hf).

The method may include forming a layer of silicon dioxide ($SiO_2$) having a first thickness, forming a layer of gold (Au) having a second thickness, and forming a layer of hafnium oxide ($HfO_2$) having a third thickness, to provide a relatively high-k overall dielectric layer, and all three layers may be formed using ALD to obtain improved control, and the dielectric layer may be amorphous after exposure to temperatures of up to 900° C.

In general, the high work function metal layer is formed at an interface between the first silicon oxide and the hafnium oxide. The work function may be defined as the amount of energy needed to remove an electron from an atom, and may roughly be about half the ionization energy of a free atom. For a typical silicon gate transistor, the work function from the substrate to the gate electrode may be about 4.15 eV, while for a metal gate transistor the work function may be about 4.2 eV for aluminum and 4.5 eV for tungsten. A high work function material such as gold may be about 4.8 to 5.1 eV, and platinum may have a work function of about 6.3 eV. The high work function metal layer may be formed of gold in one embodiment and may be formed as a layer on the silicon dioxide about 1 nm in thickness. After various heat treatments the layer may form individual nano-particles having an average diameter of less than 5 nm, which may be used as part of a gate dielectric layer forming a transistor, a capacitor, or a non-volatile memory device. The dielectric may be formed to have an equivalent oxide thickness of less than 1.0 nm and a root mean square surface roughness less than one percent of the dielectric layer thickness. The method may include forming the dielectric layers and the metal nano-particle layer by chemical vapor deposition, an atomic layer deposition, a physical deposition, sputtering, evaporation, or a combination of these methods. For example, the silicon oxide may be thermally grown, the gold layer thermally evaporated, and the hafnium oxide formed by atomic layer deposition.

Another embodiment may include forming a first dielectric layer, such as silicon dioxide, on a surface of a substrate by atomic layer deposition, including exposing a surface at a selected temperature to a first precursor material for a time period and flow volume sufficient to saturate the substrate surface with the first precursor material. The surface is then exposed to a purge for a time sufficient to remove substantially all of a non-adsorbed portion of the first precursor material from the substrate surface. The substrate surface is then exposed to a reactant material to react with the adsorbed portion of the first precursor material on the surface to form a first dielectric layer having an intermediate thickness. The surface may then undergo another purge to remove any non-reacted portion of the first reactant material and any gaseous reaction byproducts from the substrate surface. The deposition steps are repeated for a selected number of cycles until a desired oxide thickness is reached.

The method may further include forming a layer of a metal such as doped silicon, germanium, gold, or platinum, which may be formed by evaporation, sputtering, or atomic layer deposition on the first dielectric layer. The selected metal may have a high work function, such as gold.

A second dielectric layer, such as hafnium oxide, may then be formed by atomic layer deposition, similar to the method for forming the first oxide layer, but using a second temperature that may be different from the first temperature, and a second precursor material that may be different from the first precursor since it is likely that the second dielectric layer will have different desired properties.

A precursor for the first dielectric layer may include silane, dichlorosilane and silicon tetrachloride, and a reactant may include oxygen, ozone, water, hydrogen peroxide, nitrogen dioxide and nitrous oxide. For the second dielectric layer, a precursor may include hafnium tetrachloride, hafnium tetraiodide, and anhydrous hafnium nitrate, with a reactant of water, oxygen, and hydrogen peroxide. The purge materials may be the same material, flow time period, and flow rate. The first temperature may be between 340 to 375 deg C., and the second temperature between 160 to 340 deg C. The precursor and reactant flow times may be from 0.3 seconds to 3.0 seconds.

Another embodiment may include forming a semiconductive device by forming a memory array with a dielectric structure containing a layer of a high work function metal and a layer of a metal oxide in an integrated circuit and depositing a conductive material contacting the dielectric structure to form an active device such as a capacitor, transistor or non-volatile memory cell. An address decoder may be formed coupled to the memory array to complete the operational device. The dielectric structure may include a first layer of silicon oxide, a second layer of high work function nano-particles, and a third layer of hafnium oxide with a dielectric constant of about 22 to provide a very thin equivalent oxide layer for faster operation.

An embodiment may include a device having a semiconductive substrate with a dielectric layer formed of a first insulator material on a portion of the substrate with a first thickness, a high work function material (such as a metal, semiconductor or certain metal oxides) with a second thickness formed on the first insulator, a third layer formed of another insulator material having a third thickness formed on the first insulator and the high work function material, and a conductive material formed on the third layer, such as poly-silicon, metals or refractory metals. The first material may be silicon oxide having a thickness less than 1.0 nm, the second material may be gold having a thickness of less than 1.0 nm, and the third material may be hafnium oxide with a dielectric constant of greater than 22, and an equivalent silicon dioxide thickness of less than 1.0 nm. This may provide a reliable gate dielectric layer that has the equivalent performance of a much thinner silicon dioxide layer. The device could have nano-particles of gold at the interface between the first and third insulators, each having a diameter of less than 5.0 nm, and a density of greater than $3.0 \times 10^{12}$ $cm^{-2}$, and the dielectric layer is preferably amorphous.

An embodiment may include an electronic device with an amorphous dielectric structure having silicon dioxide, gold nano-particles, and a metal oxide such as titanium, zirconium, and hafnium. The device has a conductive layer on the dielectric layer. There are at least $1.0 \times 10^{12}$ $cm^{-2}$ gold nano-particles located near an interface of the silicon dioxide layer and the metal oxide layer, and the dielectric layer may have a smooth surface with a root mean square surface roughness of one percent of the dielectric layer thickness on a horizontal surface.

An embodiment may include a system having a controller and an electronic device coupled to the controller. The electronic device may have a dielectric structure with one layer of silicon dioxide, a layer of gold nano-particles, and a layer of hafnium metal oxide as part of an integrated circuit, wherein the dielectric structure forms a non-volatile memory cell. The hafnium metal oxide further has a formula of $Hf_XO_Y$, with Y selected to provide a dielectric constant value of about 22 and a band gap value of about 5.6 eV, since a low bandgap may affect the insulation properties of the portion of the dielectric layer formed of hafnium oxide. The first dielectric layer may alternatively be formed of $SiO_2$, other silicon oxides or other insulator materials such as metal oxides, metal carbides, and metal oxycarbides. Silicon dioxide layers may have a band-gap of about 8.9 eV, which would improve the leakage current over the 5.6 eV of hafnium oxide.

Various precursors, reactants, temperatures, flow times and rates have been discussed above. Specific illustrative examples will now be provided. The hafnium oxide may be formed using ALD with hafnium tetrachloride ($HfCl_4$) as the precursor and water vapor at 350° C. The precursor, purge, and reactant times are all 0.5 seconds, resulting in a hafnium oxide layer of 1.5 nm thickness per cycle.

Another embodiment includes forming an hafnium oxide using hafnium nitride, $Hf(NO_3)_4$ as the precursor at 300° C. with pulse times of 0.6 seconds, resulting in 0.36 nm films.

Another embodiment includes forming a $HfO_2$ layer using a hafnium tetrachloride ($HfCl_4$) precursor, performed at 300° C. with water vapor as the oxidizing reactant. A 0.5 second pulse of $HfCl_4$ is followed by a 0.5 second purge with an inert gas, such as nitrogen, and a 0.5 second pulse of water vapor, resulting in a layer having a thickness of 0.15 nm. Another embodiment includes deposition at 200° C., resulting in a thicker layer of hafnium oxide of 0.33 nm thickness. Yet another embodiment includes using a precursor of hafnium tetraiodide at 300° C. with water vapor, resulting in a 0.45 nm layer thickness per cycle.

An embodiment for forming silicon oxide by ALD may include a precursor of silane at 300° C. with ozone as the oxidizing reactant, resulting in a 0.50 nm layer per deposition cycle. Other solid or liquid precursors may be used in an appropriately designed reaction chamber (also known as a reactor) for any of the above noted metals. The use of such precursors in an ALD reaction chamber may result in lower deposition temperatures in the range of 180° C. to 400° C., and the ability to use mildly oxidizing reactant materials such as $H_2O$, $H_2O_2$, various alcohols, $N_2O$, ozone or oxygen. Purge gases may include nitrogen, helium, argon or neon. It should be noted that the use of the term reactant means a precursor material that is added to the ALD reactor to react with the previously introduced precursor material, to form a layer of the product material. It should be noted that there is no intrinsic difference between a precursor material and a reactant material other than the order in which they enter the reactor. The terms are used to facilitate understanding of the principles of the invention and are not used in a limiting sense.

A discussion of the equipment used to perform an ALD reaction as opposed to the equipment that may be used in a thermal oxidation, a CVD reaction, a sputtering operation or an evaporation operation will be given to clarify how the method chosen to form the layers affects the final structure.

FIG. 1 shows an embodiment of an atomic layer deposition system 100 for forming a dielectric or metal layer containing gold and hafnium oxide. The elements depicted permit discussion of the present invention such that those skilled in the art may practice the present invention without undue experimentation. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant, and purge gases to the region of the surface of substrate 108 in a uniform fashion. The gases introduced by the gas distribution fixture (sometimes referred to as a showerhead, although other configurations may be easily imagined), react with the substrate 108, with any excess precursor gas and reaction products removed from chamber 102 by vacuum pump 104 through a control valve 105. The system 100 may operate at any desired deposition pressure by controlling the volume of gas entering the chamber 102 as compared to the volume of gaseous reaction product and excess gases removed from the chamber 102 via control of the pumping rate of vacuum pump 104, and the valve 105. ALD systems may operate at normal atmospheric pressures, or may operate under essentially vacuum conditions, or anywhere in between. In an embodiment, hafnium oxide is formed at a reduced pressure of $10^{-5}$ Torr pressure with oxygen gas providing the oxidation reactant.

Each gas originates from individual gas sources 114, 118, 122, 126, 130, and 134, with a flow rate and time controlled by mass-flow controllers 116, 120, 124, 128, 132, and 136, respectively. In the present illustrative embodiment the sources 118, 122, and 126 provide the three precursor materials, either by storing the precursor as a gas or by providing a location and apparatus for evaporating a solid or liquid material to form the selected precursor gas by evaporation, sublimation, or entrainment in a gas stream.

Also included is a single purging gas source 114, although the invention is not so limited, and numerous different purge gases, such as nitrogen, argon, neon, hydrogen, and krypton may be used, individually, in combination, simultaneously, or sequentially. The purge gas source 114 is coupled to mass-flow controller 116. Two reactant material sources, 130 and 134, are connected through mass-flow controllers 132 and 136. The precursor, reactant, and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and electrical connections as are known to those skilled in the art are not shown in FIG. 1. Though illustrated ALD system 100 is suited for practicing the present invention, other commercially available ALD systems may also be used.

The use, construction, and fundamental operation of reaction chambers for deposition of films are understood by those of ordinary skill in the art of semiconductor fabrication. The present invention may be practiced on a variety of such reaction chambers without undue experimentation, or by use of CVD, evaporation or sputtering equipment. Furthermore, one of ordinary skill in the art will comprehend the detection, measurement, and control techniques in the art of semiconductor fabrication upon reading the disclosure. The elements of ALD system 100 may be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be computer controlled.

Figure 2:
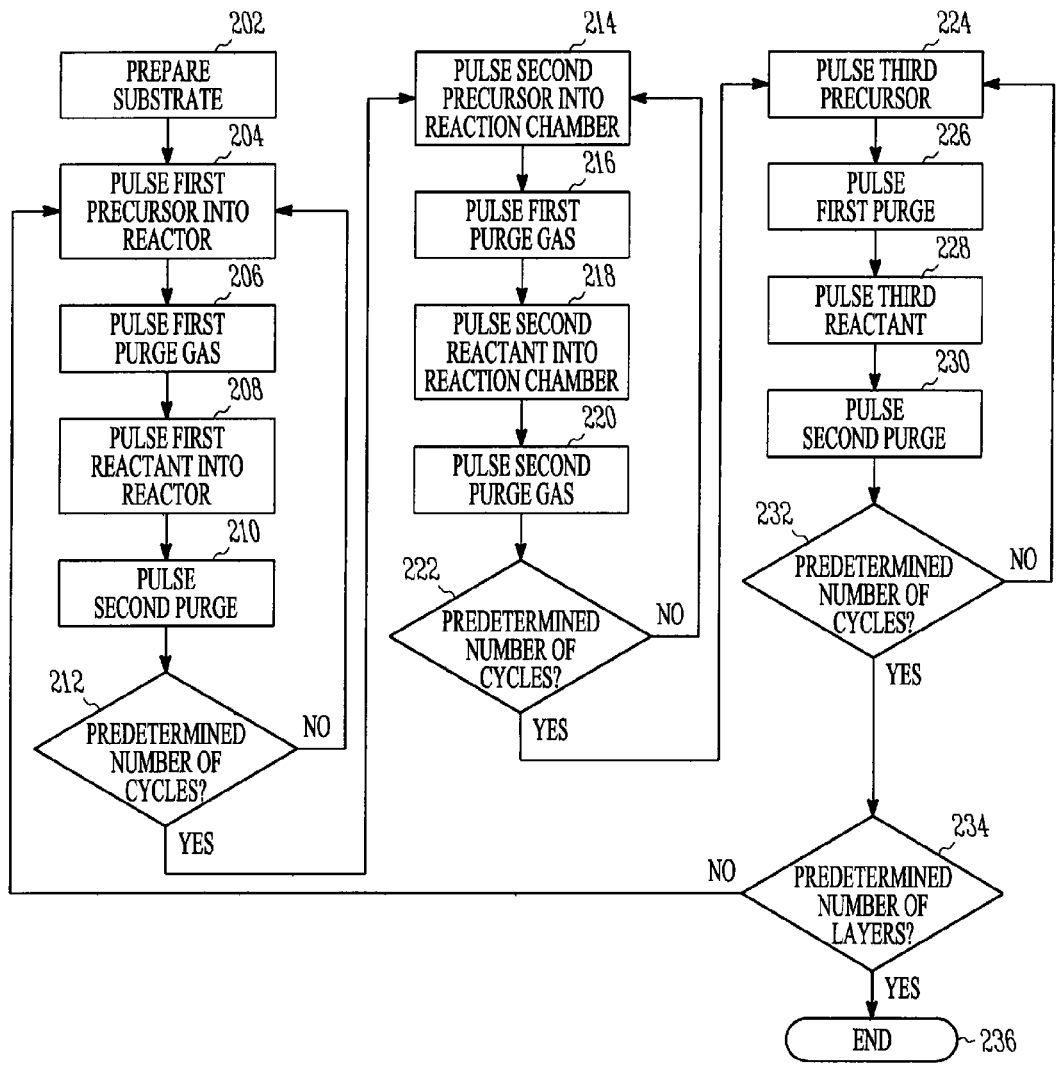
FIG. 2 illustrates a band diagram of a tunnel insulator and blocking insulator according to various embodiments of the invention.

FIG. 2 illustrates a flow diagram of operational steps for an embodiment of a general method to form a layer by ALD. There are three different materials illustrated as being deposited in an alternating fashion, but one of ordinary skill will easily understand how to use the embodiment to provide a single material, two different materials, and more than three different layers with minimal changes to the disclosed arrangement. The individual films forming the final film may be dielectric or metal layers, and may be stoichiometric pure films, such as $HfO_2$, or may be non-stoichiometric, as the final film may have any ratio of components.

At 202, a substrate is prepared to react immediately with, and chemisorb (or adsorb) the first precursor gas. This preparation will remove contaminants such as thin organic films, dirt, and native oxide from the surface of the substrate, and may include a hydrofluoric acid rinse or sputter etch in the reaction chamber 102 of FIG. 1. At 204 a first precursor material enters the reaction chamber for a predetermined length of time, for example from 0.5-2.0 seconds, preferably 1.0 seconds. Various hafnium-containing gases, liquids, and sublimating solids may be used, as discussed previously, in the described embodiment where the silicon oxide layer is formed by thermal oxidation and the gold layer is formed by evaporation. In this embodiment there will only be a single material formed by ALD. One benefit of the use of $Hf(NO_3)_4$ is that the final film may be free of carbon, hydrogen, or halogen contamination. The first precursor material is chemically adsorbed (chemisorbed) onto the surface of the substrate, the amount depending at least in part upon the temperature of the substrate, for example 300° C., and at least in part on the presence of sufficient flow of the precursor material.

At 206 a first purge gas enters the reaction chamber for a predetermined length of time sufficient to remove substantially all the non-chemisorbed first precursor material. Typical times may be 1.0-2.0 seconds, with a purge gas comprising nitrogen, argon, neon, hydrogen, and combinations thereof.

At 208 a first reactant gas enters the chamber for a predetermined length of time, sufficient to provide enough of the reactant material to chemically combine with the amount of chemisorbed first precursor material on the surface of the substrate. In an embodiment the reactant material for the first precursor comprises water vapor (i.e., $H_2O$) for a pulse length of 0.60 seconds. Typical reactant materials include mildly oxidizing materials, including, but not limited to, water vapor, hydrogen peroxide, nitrogen oxides, ozone, oxygen gas, various plasmas of the same, and combinations thereof. At 210 a second purge gas, which may be the same or different from the first purge gas, enters the chamber for a predetermined time, sufficient to remove substantially all non-reacted materials and any reaction byproducts from the chamber.

At 212 a decision is made as to whether the thickness of the first material has reached the desired thickness, or whether another deposition cycle is desired. In an embodiment, the thickness of the $HfO_2$ layer obtained from a single ALD cycle is 0.33 nm. If another deposition cycle is needed to reach the desired thickness, the operation returns to 204 and repeats the deposition process until the desired first dielectric layer is completed, at which time the process moves on to the deposition of the second material at 214.

At 214 a second precursor material for the second material (which may be a dielectric or a metal) enters the reaction chamber for a predetermined length of time, typically 0.5-2.0 seconds. The second precursor material is chemically adsorbed onto the surface of the substrate, in this case the top surface of the first material, the amount of absorption depending upon the temperature of the substrate and the presence of sufficient flow of the precursor material. In addition, the pulsing of the precursor may use a pulsing period that provides uniform coverage of an adsorbed monolayer on the substrate surface, or may use a pulsing period that provides partial formation of a monolayer on the substrate surface.

At 216 a purge gas enters the chamber, which is illustrated as being the same as the first purge gas, but the invention is not so limited. The purge gas used in the second material deposition may be the same or different from either of the two previously noted purge gases, and FIG. 1 could be shown as having more than the one purge gas source shown. The purge cycle continues for a predetermined time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate.

At 220 another purge gas enters the chamber, which may be the same or different from any of the three previously discussed purge gases, for a predetermined time sufficient to remove non-reacted materials and any reaction byproducts from the chamber.

At 222 a determination is made whether the thickness of the second material has reached the desired thickness, or whether another deposition cycle is needed. If another deposition cycle is needed, then the operation returns to 214, until the desired second dielectric layer is completed. The desired thicknesses of the first and second materials may not be the same, and there may be more deposition cycles for one material than for the other.

If the second dielectric layer has reached the desired thickness, the process moves on to 224, where a third precursor is pulsed into the reaction chamber (or reactor). The third precursor chemisorbs onto the surface. The illustrative embodiment has a particular order of precursors, which is for illustration only; the invention is not so limited, and any of the three discussed precursors may be used in any order, in accordance with desired layer characteristics.

At 226 another purge occurs to remove non-chemisorbed portions of the third precursor, and at 228 the third reactant is pulsed into the reactor. The third reactant may be the same as the previous reactants, or the third reactant may be a different material, and in an embodiment is water vapor pulsed for 0.20 seconds. At 230 another purge occurs as before.

At 232 a determination is made as to whether the third material has reached the desired thickness or whether another deposition cycle is desired. If another deposition cycle is needed, then the operation returns to 224 until the desired layer is completed. The desired thicknesses of the first, second, and third materials may not be the same thickness, and there may be more deposition cycles for one material as compared to the other. If the third material has reached the desired thickness the operation moves to 234, where it is determined if the first, second, and third dielectric materials have reached the desired number for the finished structure. In the described embodiments there are only a single layer of each of the three layers and thus the general ALD case of returning to deposit further layers of the first material will not occur.

If more than a single layer of each material were desired, then the process moves back to another deposition of the first dielectric material at 204. After the number of interleaved layers of dielectrics one, two, and three has reached the desired value, the deposition ends at 236. Although the present illustrative embodiment discusses and illustrates the layers as distinct from each other, the individual layers are very thin and may effectively act as a single alloy layer. Subsequent heat cycles may alloy the individual layers into a single dielectric layer. The present embodiment has the hafnium oxide layer deposited first, but the invention is not so limited.

The ALD process can be implemented to form transistors, capacitors, memory devices, and other electronic systems including information handling devices. The invention is not limited to the described three materials.

Figure 3:
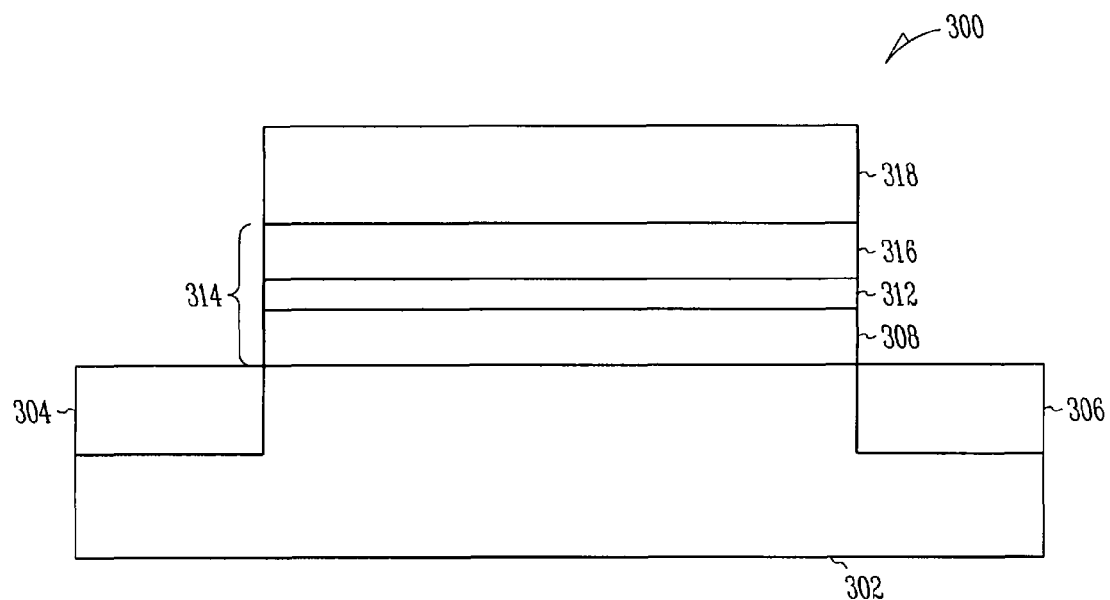
FIG. 3 illustrates another band diagram of a tunnel insulator and blocking insulator according to various embodiments of the invention.

FIG. 3 illustrates a single transistor in an embodiment of a method to form a dielectric layer containing an ALD deposited silicon oxide, gold, and hafnium oxide layer. A substrate 302 is prepared for deposition, typically a silicon or silicon-containing material; however, other semiconductor materials such as germanium, gallium arsenide, and silicon-on-sapphire substrates may also be used. This preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. The substrate 302 is typically cleaned to provide an initial substrate depleted of its native oxide, since the presence of a thin layer of $SiO_2$ will result in decreased capacitive coupling as discussed previously. The substrate may also be cleaned to provide a hydrogen-terminated surface to improve the rate of chemisorption. As an illustration, a silicon substrate may undergo a final hydrofluoric (HF) acid rinse prior to ALD processing to provide the silicon substrate with a hydrogen-terminated surface without a native silicon oxide layer. Cleaning preceding atomic layer deposition aids in reducing the presence of silicon oxide at an interface between the silicon-based substrate and the dielectric formed using the atomic layer deposition process. The sequencing of the formation of the regions of the transistor being processed may follow typical sequencing that is generally performed in the fabrication of a MOS transistor, as is well known to those skilled in the art.

The dielectric covering the area on the substrate 302 between the source and drain diffused regions 304 and 306 is deposited by ALD in this illustrative embodiment, and comprises silicon oxide layer 308, a gold layer 312, and a hafnium layer 316. This multilayer structure, which acts as a dielectric even with a gold layer 312 disposed between the two dielectric layers 308 and 316, may be referred to as the gate oxide. There may be a diffusion barrier layer, such as titanium nitride or titanium tungsten, inserted between the first dielectric layer 308 and the substrate 302 to prevent metal contamination from affecting the electrical properties of the device.

The illustrative embodiment also shows the top and bottom dielectric layers 308 and 316 as having the same thickness, however the desired dielectric properties of the gate oxide may be achieved by adjusting the dielectric thickness ratios to different values. Even though the illustrative embodiment shows the various layers 308, 312, and 316 as being distinct from one another, the gate oxide 314 overall functionally appears as a single dielectric layer.

The transistor 300 has a conductive material forming a single gate electrode 318 which may be formed of polysilicon, aluminum, tungsten, metal silicides, or any other conductive material. Use of dielectric layers containing atomic layer deposited dielectric layers for a gate dielectric is not limited to silicon-based substrates but may be used with a variety of semiconductor substrates.

Figure 4:
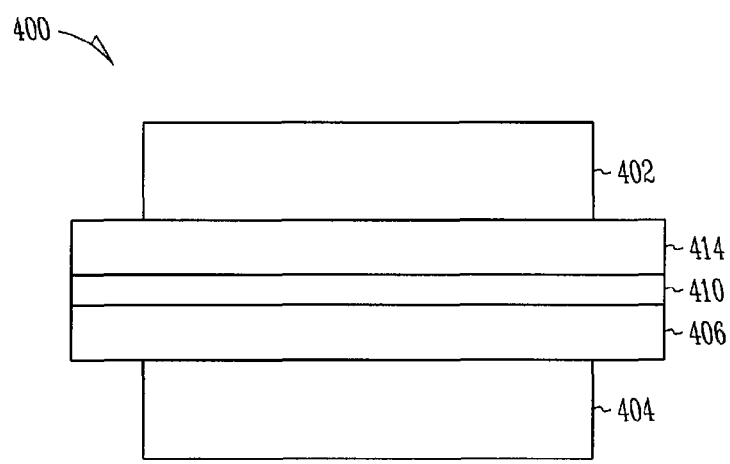
FIG. 4 illustrates a writing operation band diagram according to various embodiments of the invention.

The embodiments of methods for forming ALD deposited dielectric layers contacting a conductive layer may also be applied to forming capacitors in various integrated circuits, memory devices, and electronic systems. In an embodiment for forming a capacitor 400 illustrated in FIG. 4, a method includes forming a first conductive layer 402, a second conductive layer 404, and a dielectric having dielectric layer 406, gold nano-particle layer 410, and high-k dielectric layer 414, formed of at least three different materials, formed between the two conductive layers. The conductive layers 402 and 404 may be formed of metals, doped polysilicon, silicided metals, polycides, or conductive organic compounds, without affecting the teaching of this embodiment. Structures such as those shown in FIGS. 3 and 4 may be used in non-volatile memory devices and in other integrated circuits. Transistors, capacitors, and other devices having dielectric films may be implemented into memory devices and electronic systems including information handling devices. Embodiments of these information handling devices may include wireless systems, telecommunication systems, computers, and integrated circuits.

Figure 5:
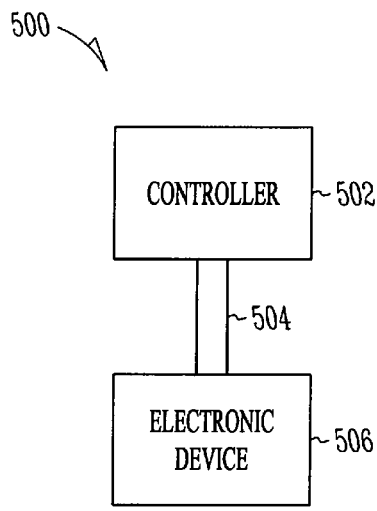
FIG. 5 illustrates a simplified block diagram of a controller coupled to an electronic device, according to various embodiments of the invention.

FIG. 5 illustrates a simplified diagram for an illustrative electronic system 500 having one or more devices including a dielectric layer containing nano-particles in a memory device or non-volatile memory device according to various disclosed embodiments. The electronic system 500 may include a controller 502, a bus 504, and an electronic device 506, where bus 504 provides electrical conductivity between controller 502 and electronic device 506. In various embodiments, the controller 502 and/or electronic device 506 may include a non-volatile memory device as previously discussed herein. Electronic system 500 may include information handling, wireless, telecommunication, fiber optic, automotive, electro-optic, mobile electronics, handheld devices, and computer systems. Electronic device 506 may comprise a microprocessor, a floating point unit, an arithmetic logic unit, a memory device, a multiplexer, an address decoder, a power controller, or any other electronic device used in computer, telecommunication, sensor, display, and other products.

Figure 6:
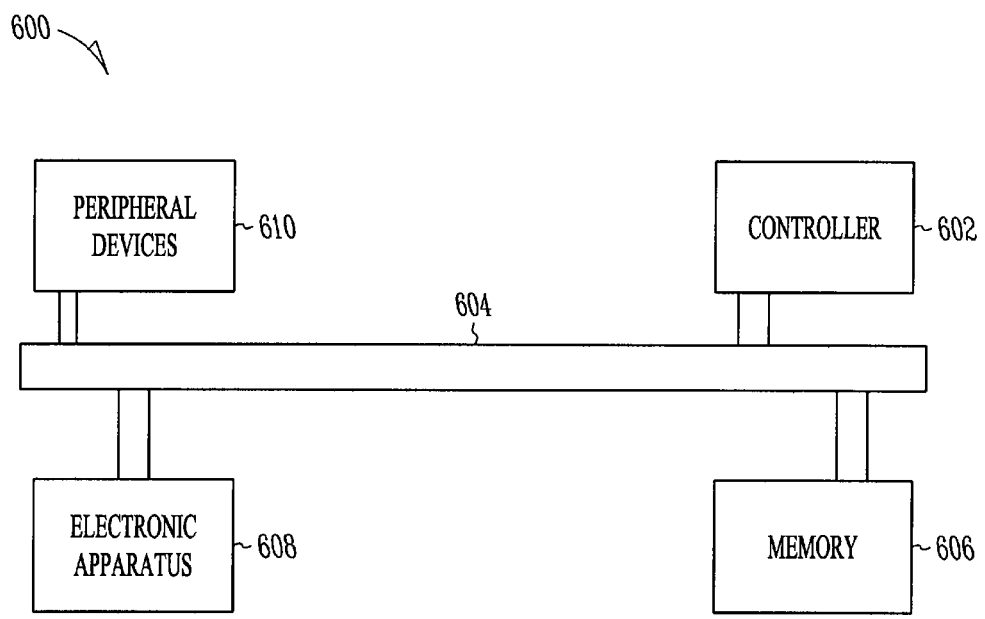
FIG. 6 illustrates an electronic system having devices formed in accordance with various embodiments of the invention.

FIG. 6 depicts a diagram of an electronic system 600 having at least one device formed in accordance to the disclosed embodiments, including a controller 602 and a memory 606. Controller 602 and/or memory 606 may include a non-volatile memory device. The system 600 may also include an electronic apparatus 608 and a bus 604, where the bus 604 may provide electrical conductivity and data transmission between controller 602 and electronic apparatus 608, and between controller 602 and memory 606. The bus 604 may include an address, a data bus, and a control bus, each independently configured. The bus 604 may use common conductive lines for providing address, data, and/or control, the use of which may be regulated by the controller 602. In some embodiments, the electronic apparatus 608 may include additional memory devices configured similar to the memory 606. Some embodiments may include an additional peripheral device 610 coupled to the bus 604. In an embodiment, the controller 602 comprises a processor. Any of the controller 602, the memory 606, the bus 604, the electronic apparatus 608, and peripheral devices 610 may include a memory device (e.g., similar to the device 506 of FIG. 5) in accordance with the disclosed embodiments.

System 600 may include, but is not limited to, information handling devices, telecommunication systems, mobile electronic devices such as laptop computers, handheld personal electronic devices such as personal digital assistants (PDA) and palm tops, handheld communication devices such as cell phones, digital cameras and DVD recorders, and computers. Peripheral devices 610 may include displays, additional storage memory, or other control devices that may operate in conjunction with controller 602 and/or memory 606.

It should be understood that some embodiments are equally applicable to any size and type of memory circuit and are not intended to be limited to a particular type of memory device. Thus, the described transistor arrangement may be used in an NROM type device, a DRAM (Dynamic Random Access Memory), SRAM (Static Random Access Memory) or flash memory. Additionally, the DRAM may comprise a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

The dielectric layer thickness may be selected to determine the overall threshold voltage of the transistor containing the dielectric structure. Some embodiments may include transistors, electronic devices, memory devices, electronic systems, and personal electronic systems having nonvolatile memory transistors constructed according to the various embodiments contained herein.

The detailed description referred to the accompanying drawings that show, by way of illustration, specific embodiments in which the present disclosed embodiments might be practiced. These embodiments are described in sufficient detail to enable those skilled in the art to practice the present invention. Other embodiments may be used, and structural, logical, and electrical changes may be made without departing from the disclosed embodiments. The various embodiments are not necessarily mutually exclusive, as some embodiments can be combined with one or more other embodiments to form new embodiments.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The present disclosed embodiments includes any other applications in which embodiments of the above structures and fabrication methods are used. The detailed description is, therefore, not to be taken in a limiting sense and the present invention is defined only by the appended claims, along with the full range of equivalents to which such claims are entitled.

What is claimed is:

1. A device comprising:
   a semiconductive substrate with a dielectric layer comprising;
   a first layer of an insulator material composed of a metal oxycarbide without containing silicon disposed on a portion of the semiconductive substrate and having a first thickness;
   a second layer of a material composed of gold nano-particles, operative as charge trapping particles, disposed on top of the first layer of the insulator material and having a second thickness, and;

a third layer of an insulator material disposed on the second layer having a third thickness; and a conductive material disposed on the third layer of insulator material.

2. The device of claim 1, wherein the first thickness is less than 1.0 nm.

3. The device of claim 1, wherein the second thickness is less than 1.0 nm.

4. The device of claim 1, wherein the third layer of the material comprises hafnium oxide having a dielectric constant of greater than 22, and an equivalent silicon dioxide thickness of less than 1.0 nm.

5. The device of claim 1, wherein the device includes a non-volatile memory cell.

6. The device of claim 1, wherein the gold nano- have an average diameter of less than 5.0 nm, and a density of greater than $3.0 \times 10^{12}$ cm$^{-2}$.

7. The device of claim 1, wherein the dielectric layer is amorphous.

8. An electronic device comprising:
an amorphous dielectric structure containing at least a first layer of metal oxycarbide without containing silicon, a second layer of gold nano-particles, and a third layer of a metal oxide selected from titanium oxide, zirconium oxide, and hafnium oxide; and
a conductive layer contacting the amorphous dielectric structure.

9. The electronic device of claim 8, wherein the amorphous dielectric structure includes at least $1.0 \times 10^{12}$ cm$^{-2}$ density of gold nano-particles located near an interface of the first layer and the metal oxide layer.

10. The electronic device of claim 9, wherein the amorphous dielectric structure has a surface with a root mean square surface roughness that is less than one percent of the dielectric average thickness on a horizontal surface.

11. A system comprising:
a controller; and
an electronic device coupled to the controller, wherein the electronic device includes a dielectric structure comprising at least one layer of metal oxycarbide without containing silicon, at least one layer of gold nano-particles, and at least one layer of hafnium metal oxide in an integrated circuit.

12. The system of claim 11, wherein the electronic device includes a non-volatile memory cell including the dielectric structure.

13. The system of claim 12, wherein the hafnium metal oxide further comprises a formula of $Hf_XO_Y$, wherein Y is selected to provide a dielectric constant value of about 22 and a band gap value of about 5.6 eV.

14. The system of claim 11, wherein the electronic device includes a memory cell in one of: an NROM type device, a DRAM, an SRAM, or a flash memory.

15. The system of claim 11, wherein the dielectric structure is formed on a substrate and further comprising a diffusion layer between the dielectric structure and the substrate.

16. The system of claim 15, wherein the diffusion layer comprises one of titanium nitride or titanium tungsten.

17. The system of claim 15, wherein the diffusion layer is configured to prevent metal contamination from affecting electrical properties of the electronic device.

18. The system of claim 11, wherein the electronic device further comprises a substrate comprising one of: silicon, germanium, gallium arsenide, or silicon-on-sapphire.

19. The system of claim 11, and further comprising a metal layer formed on the dielectric structure.

20. The system of claim 19, wherein the metal layer comprises one of doped silicon, germanium, gold, or platinum.

* * * * *